(12) United States Patent
Bandyopadhyay et al.

(10) Patent No.: US 11,018,582 B2
(45) Date of Patent: May 25, 2021

(54) ADAPTIVE SYNCHRONOUS RECTIFICATION IN A VOLTAGE CONVERTER

(71) Applicant: Texas Instruments Incorporated, Dallas, TX (US)

(72) Inventors: Saurav Bandyopadhyay, Dallas, TX (US); Michael G. Amaro, Naperville, IL (US); Michael Thomas DiRenzo, Coppell, TX (US); Thomas Matthew LaBella, Raleigh, NC (US); Robert Allan Neidorff, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/399,793

(22) Filed: Apr. 30, 2019

(65) Prior Publication Data
US 2020/0136508 A1 Apr. 30, 2020

Related U.S. Application Data

(60) Provisional application No. 62/749,784, filed on Oct. 24, 2018.

(51) Int. Cl.
*H02M 3/158* (2006.01)
*H02M 3/157* (2006.01)
(Continued)

(52) U.S. Cl.
CPC ............. *H02M 3/158* (2013.01); *H02M 1/08* (2013.01); *H02M 3/157* (2013.01); *H03K 5/24* (2013.01);
(Continued)

(58) Field of Classification Search
CPC ...... H02M 3/158; H02M 3/155; H02M 3/156; H02M 3/157; H02M 3/1563
(Continued)

(56) References Cited

U.S. PATENT DOCUMENTS

| 6,396,252 B1* | 5/2002 | Culpepper | H02M 3/156 323/285 |
| 7,372,241 B1* | 5/2008 | Tomiyoshi | H02M 3/1588 323/224 |

(Continued)

OTHER PUBLICATIONS

Hua, Guichao et al. "Novel Zero-Voltage-Transition PWM Converters." IEEE Transactions on Power Electronics, vol. 9, No. 2, Mar. 1994. pp. 213-219.
(Continued)

*Primary Examiner* — Nguyen Tran
(74) *Attorney, Agent, or Firm* — Lawrence J. Bassuk; Charles A. Brill; Frank D. Cimino

(57) ABSTRACT

A circuit includes a first transistor and a second transistor coupled to the first transistor at a switch node and to a ground node. An estimator circuit receives a first signal to control an on and off state of the first transistor. The estimator circuit generates a second signal to control the on and off state of the second transistor. The second signal has a pulse width based on a pulse width of the first signal. A clocked comparator includes a clock input, a first input, and a second input. The first input receives a voltage indicative of a voltage of the switch node. The second input is coupled to a ground node. The clock input receives a third signal indicative of the second signal. The clocked comparator generates a comparator output signal. The estimator circuit adjusts the pulse width of the second signal based on the comparator output signal.

12 Claims, 10 Drawing Sheets

(51) Int. Cl.
*H03K 5/24* (2006.01)
*H02M 1/08* (2006.01)
*H02M 1/00* (2006.01)

(52) U.S. Cl.
CPC ............... *H02M 2001/0003* (2013.01); *H02M 2001/0058* (2013.01)

(58) Field of Classification Search
USPC .......................................... 323/271, 282–285
See application file for complete search history.

(56) References Cited

U.S. PATENT DOCUMENTS

| | | | | |
|---|---|---|---|---|
| 8,093,876 | B2* | 1/2012 | Araki | H02M 3/156 323/283 |
| 10,141,845 | B2 | 11/2018 | Bandyopadhyay et al. | |
| 2012/0235656 | A1* | 9/2012 | Otsuka | H02M 3/1588 323/282 |
| 2015/0340942 | A1* | 11/2015 | Tang | H02M 1/00 323/282 |
| 2016/0308441 | A1* | 10/2016 | Chen | H02M 3/158 |
| 2017/0126121 | A1* | 5/2017 | Wang | H02M 3/158 |
| 2019/0058394 | A1 | 2/2019 | Neidorff et al. | |
| 2019/0191744 | A1* | 6/2019 | Vega | A23C 9/1565 |

OTHER PUBLICATIONS

Michal, Vratislav. "Inductor Current Zero-Crossing Detector and CCM/DCM Boundary Detector for Integrated High-Current Switched-Mode DC-DC Converters." IEEE Transactions on Power Electronics, vol. 29, No. 10, Oct. 2014. pp. 5384-5391.

* cited by examiner

ADAPTIVE SYNCHRONOUS RECTIFICATION IN A VOLTAGE CONVERTER

CROSS-REFERENCE TO RELATED APPLICATIONS

The present application claims priority to U.S. Provisional Patent Application No. 62/749,784, filed Oct. 24, 2018, which is incorporated herein by reference in its entirety.

BACKGROUND

Step-down voltage regulators (also called voltage converters) generate a regulated output voltage that is smaller than the input voltage to the regulator. Some voltage regulators are implemented as switching regulators in which transistors coupled to an inductor are generally reciprocally turned on and off by pulse width modulation (PWM) control logic. Some switching regulators are capable of continuous conduction mode (CCM) operation and discontinuous conduction mode (DCM) operation. In CCM operation, current continuously flows through the inductor. CCM operation is often used for higher load current applications. For low load current applications, the switching regulator may be transitioned into DCM operation. During DCM operation, the current through the inductor does drop and remains at zero during a portion of each PWM cycle.

SUMMARY

In some examples, a circuit includes a first transistor and a second transistor coupled to the first transistor at a switch node and to a ground node. An estimator circuit is included and is configured to receive a first signal to control an on and off state of the first transistor. The estimator circuit is configured to generate a second signal to control the on and off state of the second transistor. The second signal is configured to have a pulse width based on a pulse width of the first signal. A clocked comparator includes a clock input, a first input, and a second input. The first input is configured to receive a voltage indicative of a voltage of the switch node. The second input is coupled to a ground node. The clock input is configured to receive a third signal indicative of the second signal. The clocked comparator is configured to generate a comparator output signal. The estimator circuit is configured to adjust the pulse width of the second signal based on the comparator output signal.

In another example, a method includes, based on an on-time for a first transistor, determining an initial on-time for a second transistor. The method further includes turning off the second transistor using the determined on-time for the second transistor. The method also includes determining, using a clocked comparator, that a voltage on a node between the first and second transistors is not zero volts upon turning off the second transistor. Responsive to the voltage on the node determined not to be zero volts, the method includes changing the on-time for the second transistor.

BRIEF DESCRIPTION OF THE DRAWINGS

For a detailed description of various examples, reference will now be made to the accompanying drawings in which.

DETAILED DESCRIPTION

A buck converter is a type of step-down switching regulator. A buck converter (e.g., a synchronous buck converter) includes a high side transistor coupled to a low side transistor at a switch node. One terminal of the high side transistor is coupled to an input voltage node (VIN). An inductor is coupled to the switch node, and a capacitor couples between the inductor and a ground node. When the high side transistor is on, the low side transistor is off, and the voltage on the switch node is pulled up to (or close to) VIN. Current through the inductor increases while the high side transistor is on. When the high side transistor is turned off and the low side transistor is turned on, energy stored in the inductor is used to continue the flow of current through the inductor to the load. When the low side transistor is on, the current flows from the ground node and through the low side transistor to the inductor. When the low side transistor is on, the current through the inductor continues to flow but at a decreasing rate. Eventually, during DCM operation the current falls to zero and remains at zero until the start of the next switching cycle.

If the low side transistor is turned off too soon (i.e., before the inductor current falls to zero during DCM operation), current will continue to flow through the body diode of the low side transistor resulting in a switching loss through the low side transistor. The inductor current rings at low amplitudes as it approaches zero. Thus, a switching loss will also occur if the low side transistor is turned off too late (i.e., after the inductor current passes zero and begins to ring). Thus, during DCM operation, to avoid switching losses, the low side transistor should be turned off coincident with the inductor current falling to and equaling zero amperes.

Figure 1:
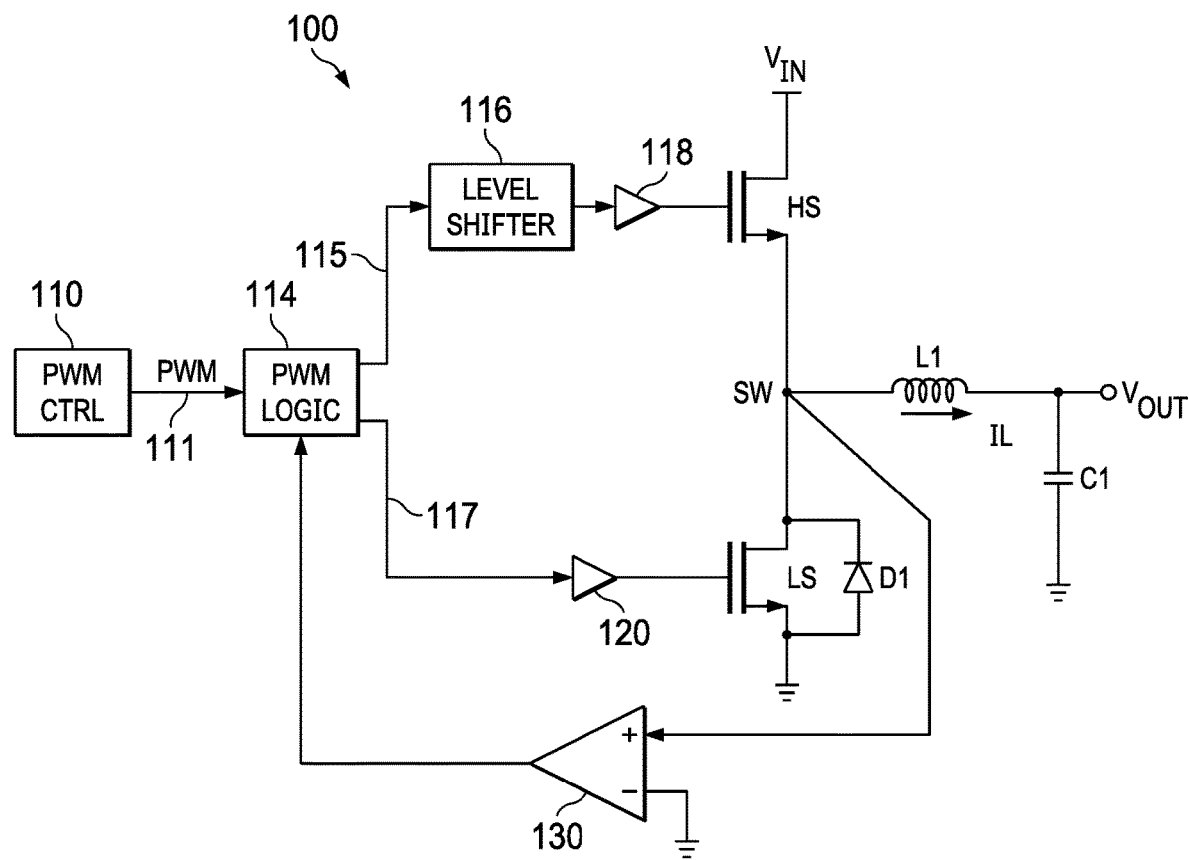
FIG. 1 shows an example of a buck converter with a continuous time voltage comparator.

FIG. 1 shows an example of a switching regulator 100 as a buck converter. A high side (HS) metal oxide semiconductor field effect transistor (referred to as a "FET" herein) includes a gate, a drain, and a source. The drain of HS FET is connected to an input voltage node (VIN). A low side (LS) FET also includes a gate, a drain, and a source. The drain of the LS FET is connected to the source of the HS FET at a node labeled as the switch node (SW). The source of the LS FET is connected to a reference node, which may be the ground node in this example, but could be reference voltage nodes other than ground in other examples.

A pulse width modulation (PWM) controller 110 generates a PWM control signal 111. In one example, when the PWM control signal 111 is high, the HS FET is to be on, and when the PWM control signal 111 is low, the LS FET is to be on, albeit with an idle time between the HS FET being on and the LS FET being on to prevent a shoot-through condition in which both the HS and LS FETs are on concurrently. PWM logic 114 receives the PWM control signal 111 and generates separate transistor control signals 115 and 117. Transistor control signal 115 is provided to a level shifter 116, which changes the voltage level of the transistor control signal 115 to a suitable voltage to turn on the HS FET given that the voltage on its source terminal is above the ground potential. A driver 118 receives the level shifter's output signal and generates the signal to drive the gate of the HS FET. A driver 120 is also provided to receive the transistor control signal 117 to drive the gate of the LS FET. Because the source of the LS FET is tied to the ground potential, a level shifter is not needed in this example.

A body diode D1 is shown across the source and drain terminals of the LS FET. As noted above, if the LS FET were turned off before the current through inductor L1 (IL) drops to zero, current can still flow through the body diode D1 of the LS FET.

The drain-to-source voltage (VDS) across the LS FET is a function of the current through the LS FET. The LS FET's VDS is given by VDS=IL×Rds_on, where IL is the current through inductor L1 and Rds_on is the drain-to-source resistance of the LS FET when the LS FET is on. Thus, VDS of the LS FET is a function of IL, and can be used to determine when IL falls to zero during DCM operation.

The switching regulator 100 of FIG. 1 also includes a continuous time voltage comparator 130. The voltage comparator 130 compares the switch node voltage to the ground potential. In this example, the output of the voltage comparator 130 is high while the switch node voltage is above the ground potential. The voltage comparator's output changes state (e.g., becomes low) when the switch node voltage reaches and/or falls below the ground potential, which is indicative of IL falling to zero. The voltage comparator's output is provided to the PWM logic 114, and the PWM logic 114 responds to the voltage comparator's output becoming low by turning off the LS FET.

As noted above, voltage comparator 130 is a continuous time voltage comparator, which means that the voltage comparator 130 continuously compares its input voltages (ground and the switch node voltage) and continuously generates an output signal. As such, the voltage comparator 130 consumes a substantial amount of power. Further, as soon as IL drops to zero, the LS FET should be turned off with very little time delay. As with any circuit, there is a propagation delay through the voltage comparator 130. Reducing the propagation delay through the voltage comparator 130 generally requires a large quiescent current through the comparator and may require large transistors within the voltage comparator. For these reasons, the voltage comparator 130 of FIG. 1 is large and the power consumption of the comparator is substantial, and thus potentially detrimental to low power and space-constraint applications.

Figure 2:
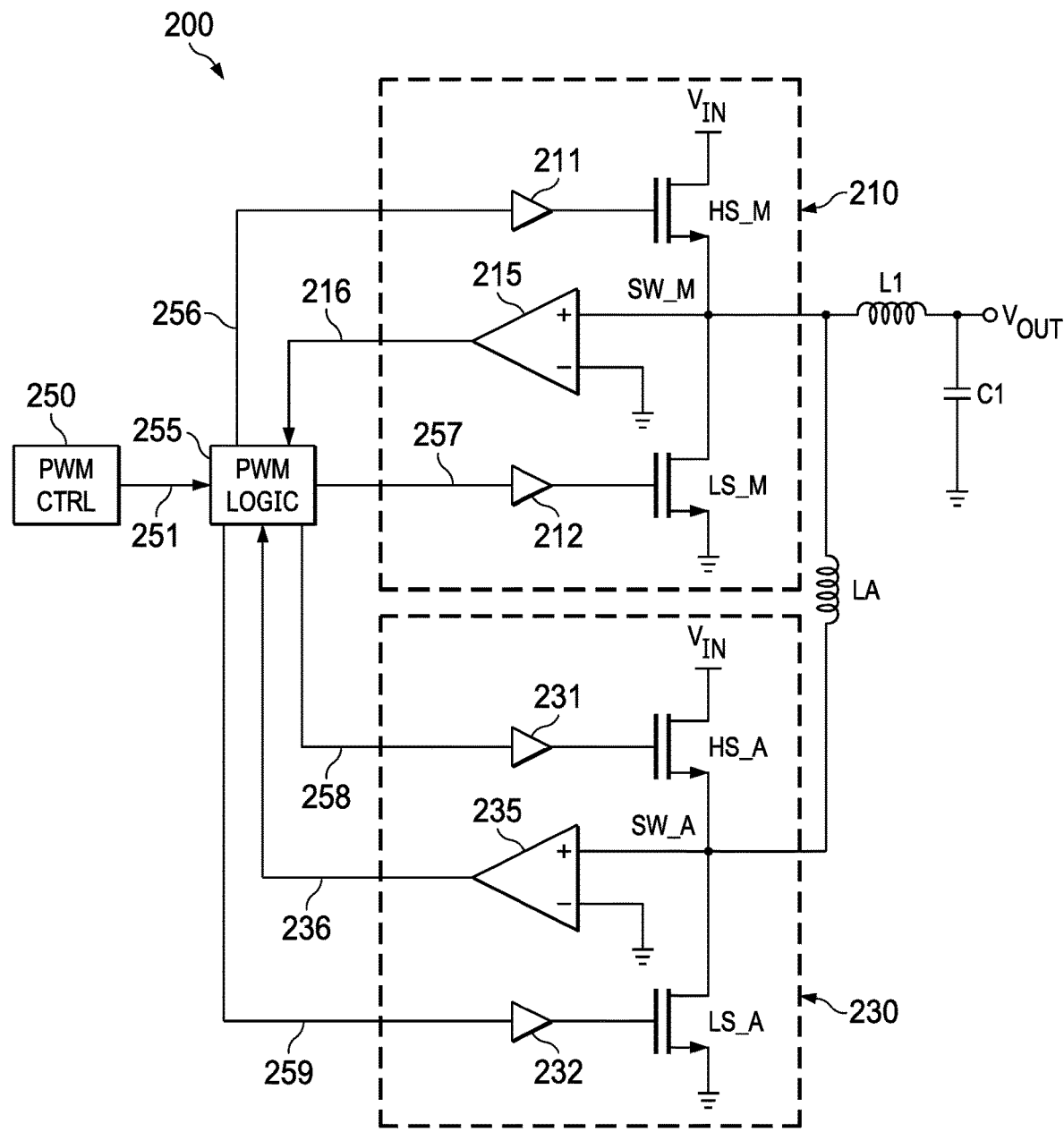
FIG. 2 shows an example of a zero-voltage transition (ZVT) buck converter with a continuous time voltage comparator.

FIG. 2 shows an example of a zero-voltage transition (ZVT) buck converter 200. The ZVT buck converter 200 of FIG. 2 includes a PWM controller 250, PWM logic 255, a main half bridge circuit 210, an auxiliary half bridge 230, a main inductor L1, an auxiliary inductor LA, and a capacitor C1. The main half bridge circuit 210 is similar that of FIG. 1 and includes a main high side FET (HS_M) coupled to a main low side FET (LS_M) at a main switch node SW_M. The main half bridge circuit 210 also includes drivers 211 and 212 and a continuous time voltage comparator 215. Inductor L1 is connected to the main switch node SW_M. A level shifter is not shown for simplicity. The continuous time voltage comparator 215 compares the voltage on SWM to ground, and provides a comparator output signal 216 to the PWM logic 255 to indicate when the LS_M transistor should be turned off, as explained above.

The auxiliary half bridge circuit 230 has a similar architecture to that of the main half bridge circuit 210. The auxiliary half bridge circuit 230 includes an auxiliary high side FET (HS_A) coupled to an auxiliary low side FET (LS_A) at an auxiliary switch node SW_A. The auxiliary half bridge circuit 230 also includes drivers 231 and 232 and a continuous time voltage comparator 235. Auxiliary inductor LA is connected between the main switch node SW_M and the auxiliary switch node SW_A. The continuous time voltage comparator 215 compares the voltage on SW_A to ground, and provides a comparator output signal 236 to the PWM logic 255 to indicate when the LS_A transistor should be turned off.

A PWM control signal 251 is generated by the PWM controller 250 and is provided to the PWM logic 255. The PWM logic 255 generates transistor control signals 256, 257, 258, and 259. Transistor control signal 256 controls the on/off state of the HS_M FET. Transistor control signal 257 controls the on/off state of the LS_M FET. Transistor control signal 258 controls the on/off state of the HS_A FET. Transistor control signal 259 controls the on/off state of the LS_A FET.

Figure 3:
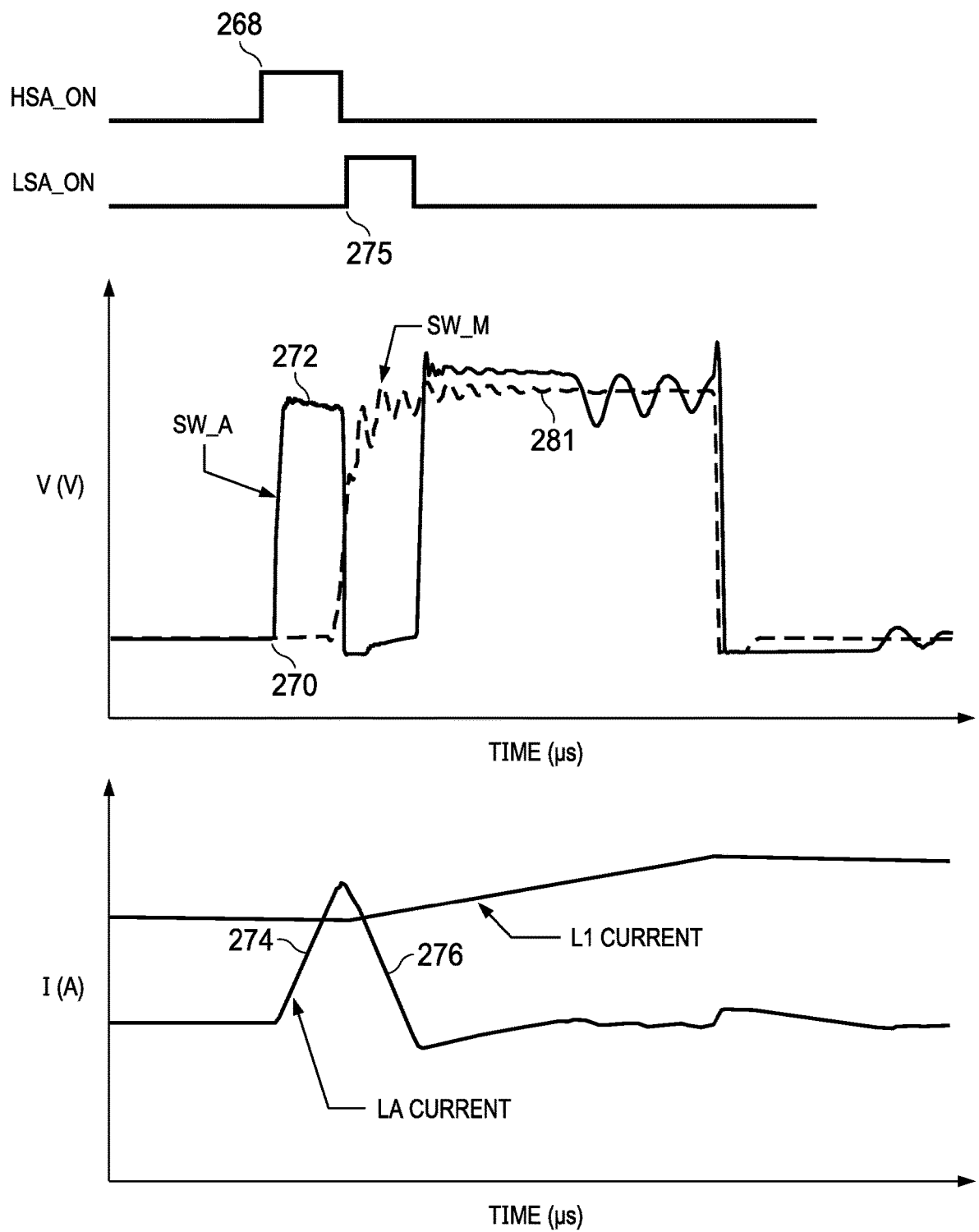
FIG. 3 shows a timing diagram illustrating the operation of the ZVT buck converter of FIG. 2.

FIG. 3 shows a timing diagram to illustrate the operation of the ZVT buck converter 200 of FIG. 2. During operation, while the LS_M FET is on and just before the PWM logic 255 is to turn on the HS_M FET, the PWM logic 255 turns on the HS_A FET at 268. At this point during the cycle, both the LS_M and HS_A FETs are on. Current flows through the HS_A FET, through inductor LA, and through the LS_M FET to ground. The current through inductor LA ramps up as shown at 274. The LS_M FET is then turned off, and the energy stored in the inductor LA causes the voltage on SW_M to increase towards VIN. As such, when the PWM logic 255 turns on the HS_M FET, the voltage on the SW_M node is already equal to, or nearly equal to, VIN, which helps to increase the efficient of the voltage regulator. When both the LS_M and HS_A FETs are on, the voltage on SWM is approximately equal to the ground potential, and the voltage on the SW_A node is approximately equal to VIN. Thus, the voltage difference between the SW_A and SW_M nodes is VIN, which is the voltage across the inductor LA (set interval for inductor LA).

During another portion of the PWM cycle, the HS_M and LS_A FETs are on. FIG. 3 illustrates the HS_A_FET turning off at 269, and the LS_A_FET turning on at 275. While the L_SA_FET is on the current through the auxiliary inductor LA ramps down as shown at 276. With the HS_M and LS_A FETs on, the voltage on SW_M is approximately equal to VIN (as shown at 281), and the voltage on the SW_A node is approximately equal to the ground potential. Thus, the voltage difference between the SW_A and SW_M nodes is VIN, which is the voltage across the inductor LA (reset interval for inductor LA).

Continuous time voltage comparators 215 and 235 are used in this example of a ZVT buck converter 200. As such, the same deficiencies exist with ZVT buck converter 200 of FIG. 2 as for the buck converter 100 of FIG. 1, namely, high power consumption and large size due to the need for the voltage comparators 215 and 235 to continuously compare their input voltages and have a low propagation time.

In accordance with the following examples, a voltage regulator is described that includes a zero-current crossing detector circuit without the use of power hungry, continuous time voltage comparators. Instead, the zero-current crossing detector circuit estimates the on-time of the low side FET, and then refines the estimate using a low power, high speed clocked comparator (instead of a continuous time voltage comparator). Estimating the on-time of the low side FET and then refining the estimate is referred to herein as "adaptive synchronous rectification." Because the comparator is clocked, it does not continuously and actively compare the voltages on its inputs, and thus does not have a substantial and continuous quiescent current. Further, to be fast, a continuous time voltage comparator includes large transistors to produce large currents. By contrast, a clocked comparator does not require a low delay. However, the clocked comparator must capture the input signals quickly, but capturing the input signals quickly does not require large transistors. Thus, all else being equal, a clock comparator generally is substantially smaller than a continuous time comparator.

As explained above, the PWM logic generates a transistor control signal to turn on and off the LS FET. Once the LS FET is turned on, the period of time for which the LS FET should be maintained in its on state can be estimated as follows. During the steady state, the average voltage across the voltage regulator's inductor should be 0V. In the following discussion, the amount of time that the HS FET is on is represented as Ton_HS, and the amount of time that the LS FET is on is represented as Ton_LS. The voltage across the inductor when the HS FET is on is represented as VSET, and the voltage across the inductor when the LS FET is on is represented as VRESET. For a switching voltage regulator, such as a buck converter, ZVT buck converter, etc.:

$$Ton\_LS \times VRESET = Ton\_HS \times VSET \quad (1)$$

That is, the product of the voltage across L1 and the on-time of the LS transistor should equal the voltage across L1 and the on-time of the HS transistor. As such, the on-time for the LS FET (Ton_LS) can be estimated as:

$$Ton\_LS = Ton\_HS \times \frac{VSET}{VRESET} \quad (2)$$

Figure 4:
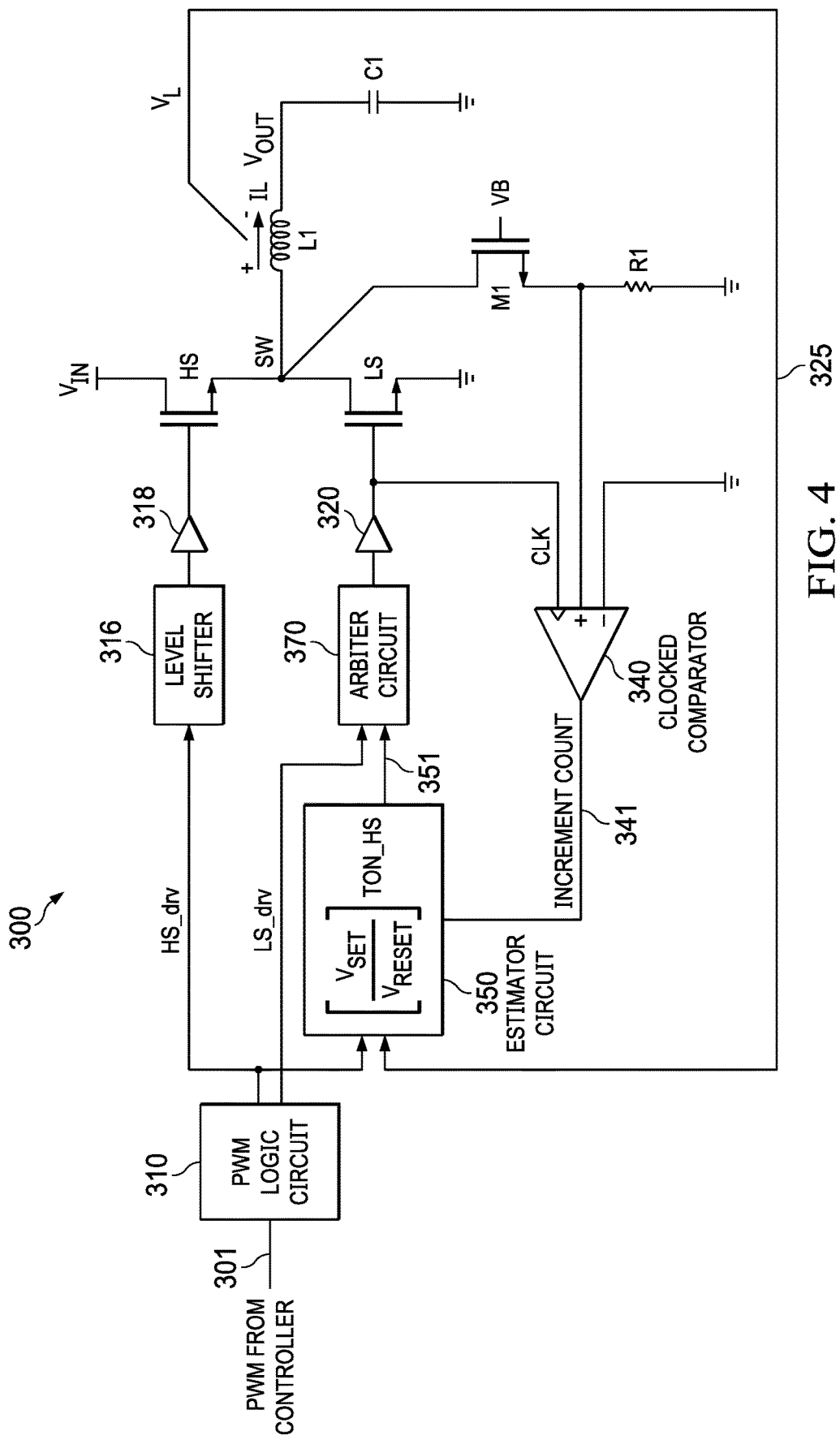
FIG. 4 shows an example of a buck converter with an estimator circuit and clocked comparator.

FIG. 4 shows an example of a buck converter 300 which estimates the length of time the LS FET is to be on (Ton_LS) and refines that estimate using a clocked comparator. The buck converter 300 of FIG. 4 includes PWM logic circuit 310, a level shifter 316, drivers 318 and 320, a HS FET, a LS FET, an inductor L1, a capacitor C1, a transistor M1, a resistor R1, a clocked comparator 340, an estimator circuit 350 (also referred to as a volt-second balancer circuit), and an arbiter circuit 370. As described above, the drain of HS FET is connected to the input voltage node VIN, and the source of the HS FET is coupled to the drain of the LS FET at switch node SW. One terminal of inductor L1 is connected to the SW node, and the other terminal of the inductor L1 is connected to capacitor C1 to provide an output voltage node (VOUT).

A PWM control signal 301 from a PWM controller is provided to the PWM logic circuit 310, which in turn generates high and low side drive signals (HS_drv and LS_drv, respectively) to control the on and off state of the respective HS and LS FETs. Level shifter 316 modifies the voltage level of the HS_drv signal for the HS FET. Drivers 318 and 320 generate the gate control signals for the respective HS and LS FETs.

The estimator circuit 350 receives, as inputs, the HS_drv signal, a signal 325 indicative of the inductor voltage (VL), and the comparator output signal 341 from the clocked comparator 340. VL may be generated by, for example, a sample-and-hold circuit coupled across the inductor L1. In one example, from the HS_drv signal, the estimator circuit 350 determines Ton_HS, and then determines $$Ton\_HS \times \frac{VSET}{VRESET},$$

or a value indicative of $$Ton\_HS \times \frac{VSET}{VRESET},$$

to estimate Ton_LS. The LS_drv signal is asserted (e.g., logic high) to turn on the LS FET. The estimate of Ton_LS from the estimator circuit 350 is used to determine when to turn off the LS FET. Thus, the estimator circuit 350 asserts its output signal 351 after expiration of a Ton_LS time period following the LS_drv signal turning on the LS FET. Active assertion of the output signal 351 can be high or low as desired. The arbiter circuit 370 responds to the assertion of the output signal 351 by forcing the LS FET's gate voltage low to turn off the LS FET.

However, the estimate of Ton_LS from Eq. (2) above does not take into account the Rds_on of the HS FET, the Rds_on of the LS FET, or the series resistance of the inductor L1. Thus, the estimate of Ton_LS from Eq. (2) is a close, but not exact, estimate of Ton_LS. The Ton_LS estimate is adjusted using the clocked comparator 340. The clocked comparator 340 includes a positive input (+), a negative input (−), and a clock input. The negative input in this example is connected to the ground potential. The positive input is connected to the switch node SW via the source follower circuit comprising M1 and R1. The drain of M1 is coupled the SW node and the source of M1 is connected to the positive input of the comparator 340. R1 is coupled between the source of M1 and the ground potential. The gate of M1 is coupled to a bias voltage (VB). The voltage across R1 is a function of the voltage on the SW node. The clock input of the clocked comparator 340 receives a signal indicative of when the LS FET is turned off. In the example shown in FIG. 4, the clock input of the comparator 340 is connected to the gate of the LS FET. When the voltage on the gate of the LS FET transitions from high to low, the LS FET is turned off, and that high to low signal transition clocks the clocked comparator 340. That is, in this example a falling edge on the clock input of the clocked comparator 340 causes the output signal 341 to reflect the relationship between the positive and negative inputs.

When the comparator 340 is clocked, it generates a comparator output signal 341 that is high in this example when the SW node voltage is greater than the ground potential, or low when the SW node voltage is less than the ground potential. The comparator's output signal 341 thus indicates whether or not the VDS of the LS FET (and thus IL) has reached zero when the LS FET is turned off. The comparator's output signal 341 is used by the estimator circuit to modify the estimate of Ton_LS. The estimate of Ton_LS, for example, can be increased if the comparator's output signal 341 indicates that IL was still greater than 0 amperes when the LS FET was turned off. In the PWM cycle, the LS FET may be turned off slightly later than in the previous cycle due to a new and slightly larger estimate of Ton_LS. The estimate of Ton_LS can be iteratively adjusted up or down until the clocked comparator's output signal 341 indicates that IL reached 0 amperes when the LS FET was turned off.

The buck converter 300 in the example of FIG. 4 can be used in CCM operation and in DCM operation. During CCM operation, the inductor current IL does not remain at 0 amperes during a portion of each switching cycle, and thus the estimate of Ton_LS from the estimator circuit 350 is not needed. Instead, LS_drv signal dictates when the LS FET is to be turned on and when it is to be turned off. The arbiter circuit 370 is included in this example to make the buck converter 300 function seamlessly in CCM or DCM operation. The arbiter circuit 370 examines the output signal 351 from the estimator circuit 350 and compares it to the LS_drv signal. If the output signal 351 from the estimator circuit 350 is asserted to turn off the LS FET before the LS_drv signal is de-asserted to turn off the LS FET, then the buck converter 300 is in DCM, and the arbiter circuit 350 will use the output signal 351 to turn off the LS FET. However, if LS_drv is de-asserted before the end of the Ton_LS time period estimated by the estimator circuit 350 (the converter is in CCM operation), then the arbiter circuit 370 will turn off the LS FET responsive to the de-assertion of the LS_drv signal. That is, the LS FET is turned off responsive to the first of the LS_drv or the output signal 351 from the estimator circuit 350 to be de-asserted.

Figure 5:
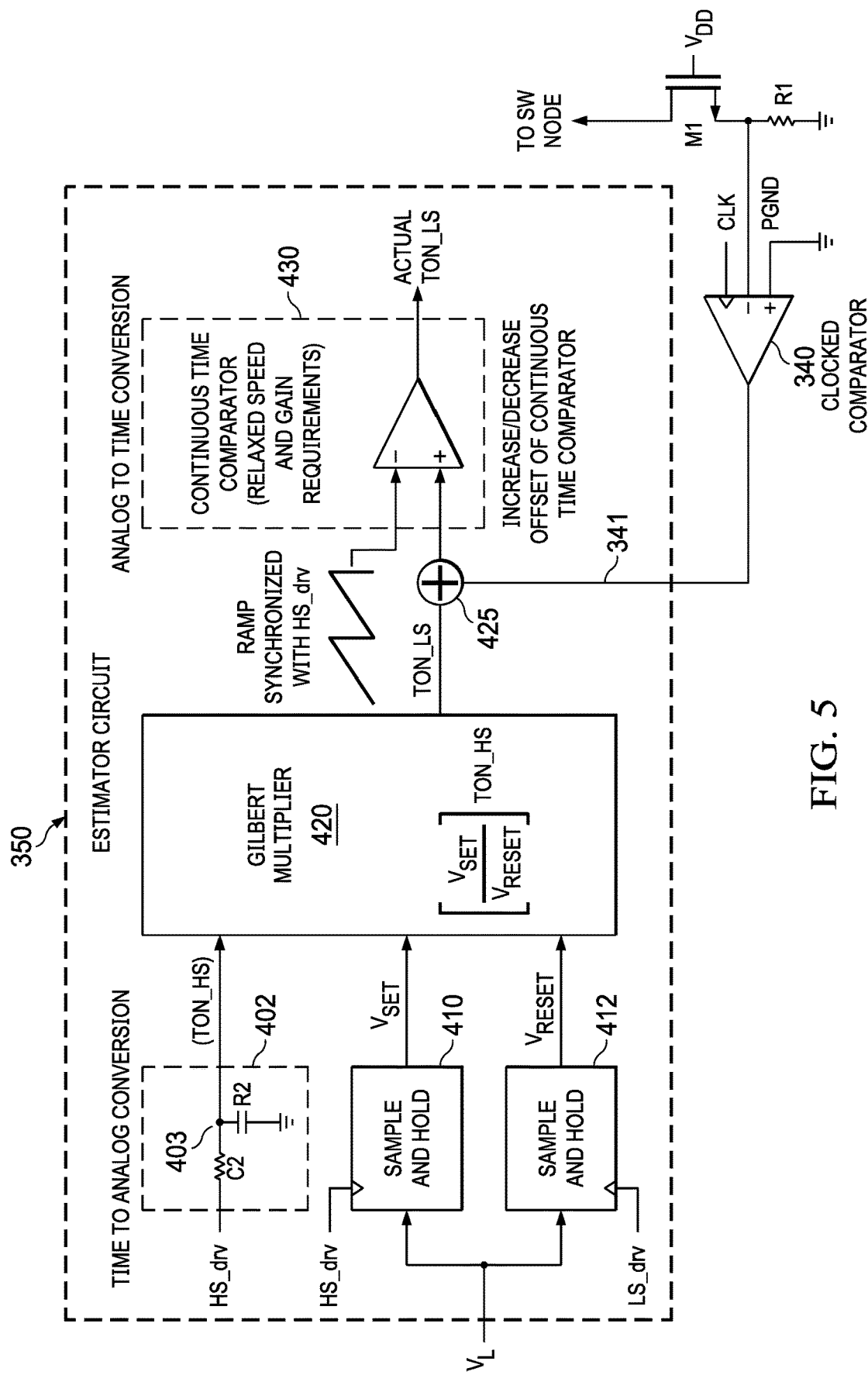
FIG. 5 shows an example implementation of the estimator circuit of FIG. 4.

FIG. 5 shows an example implementation of the estimator circuit 350. The estimator circuit 350 in this example includes an averager circuit 402, sample-and-hold circuits 410 and 412, a Gilbert multiplier 420, an adder 425, and a comparator 430. The averager circuit 402 includes a capacitor C2 connected to a resistor R2. The output signal from node 403 comprises a voltage that is the average HS_drv voltage, and thus is a function of the on-time of the HS FET (Ton_HS). Sample-and-hold circuits 410 and 412 sample the inductor voltage VL and hold the sampled inductor voltage as VSET and VRESET, respectively. The sample-and-hold circuit 410 is clocked with the HS_drv signal and the sample-and-hold circuit 412 is clocked with the LS_drv signal.

The Gilbert multiplier 420 generates an output signal that is proportional to the product of its input signals. The Gilbert multiplier 420 in this example determines the ratio of VSET to VRESET and then determines the product of that ratio with the signal from the averager circuit 402 that is a function of Ton_HS. A Gilbert multiplier is an analog circuit that produces an analog output proportional to the product of its input signals. A Gilbert multiplier replies on the logarithmic/exponential operation of bipolar junction transistors. Gilbert multipliers rely on the fact that the exponential of the sum of logarithms of values is equal to the product of the value (e.g., exp(ln A+ln B)=A*B). The base-emitter voltage of a transistor is related to the log of the current through the transistor. Alternatively stated, the current through a transistor is the exponential of the base-emitter voltage of the transistor. In a Gilbert Multiplier, the inputs are converted into currents and applied to bipolar transistors. The base-to-emitter voltages of the transistors are added and applied to another transistor. The current in the latter transistor is proportional to the product of the currents in the first two transistors. Other types of multiplier circuits can be used as well.

The estimate of Ton_LS from the Gilbert multiplier 420 is then modified by adder 425 using the output signal 341 from the clocked comparator 340. Adder 425 increases or decreases the analog voltage TON_LS based on whether the output 341 of the clocked comparator 340 is logic high or logic low. For example, TON_LS is increased if the comparator's output 341 is logic high, and decreased if output 341 is logic low. The amount of the increase or decrease is predetermined.

Figure 6:
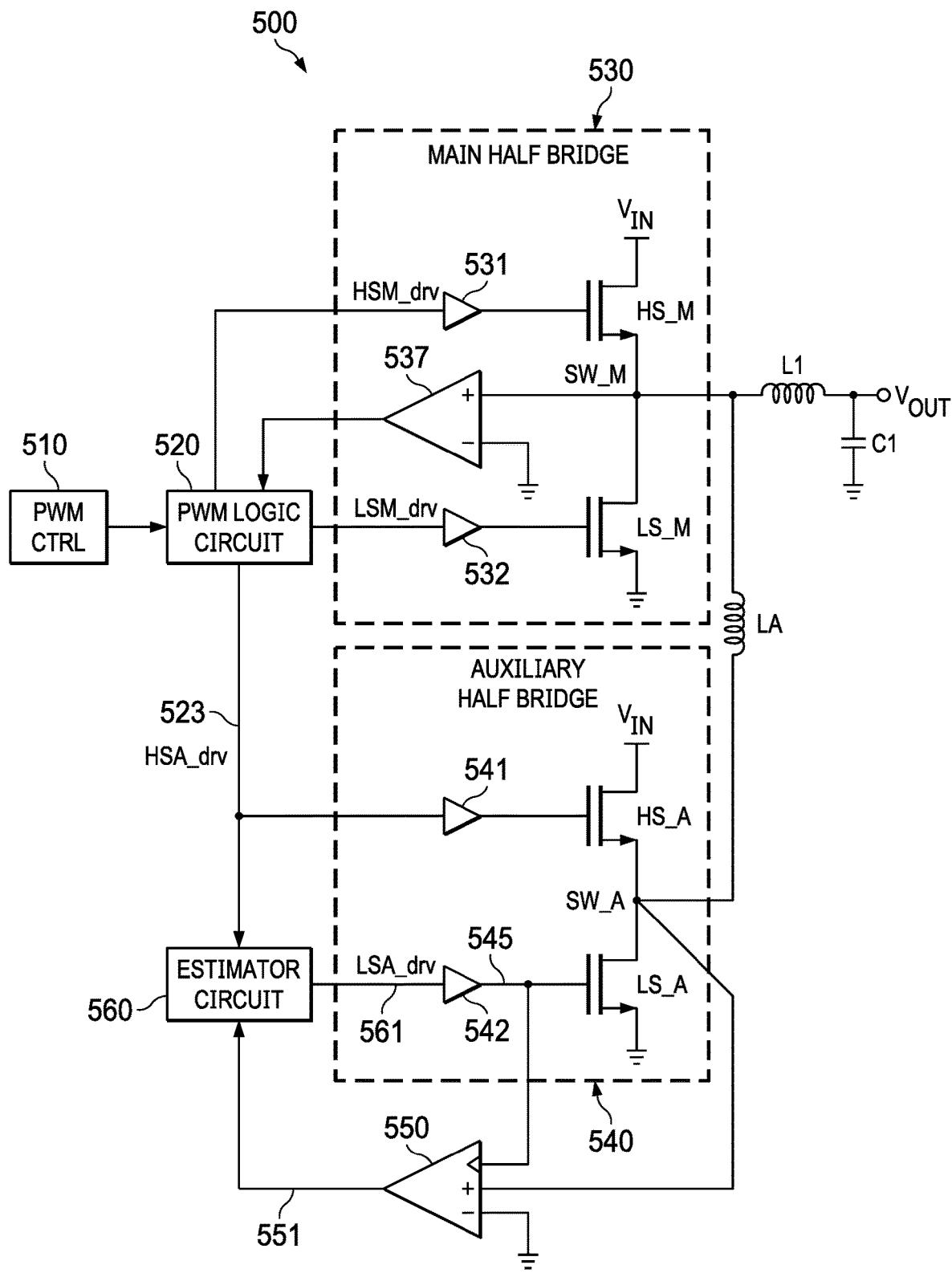
FIG. 6 shows an example of a ZVT buck converter with an estimator circuit and clocked comparator.

FIG. 6 shows an example of a ZVT buck converter 500. The ZVT buck converter 500 includes a PWM controller 510, PWM logic circuit 520, a main half bridge circuit 530, an auxiliary half bridge circuit 540, a clocked comparator 550, and an estimator circuit 560. The main half bridge circuit 530 includes a high side main (HS_M) transistor, a low side main (LS_M) transistor and corresponding drivers 531 and 532. The HS_M and LS_M transistors comprise n-type FETs in this example, but can comprise other types of transistors (p-type instead of n-type FETs, bipolar junction transistors instead of FETs, etc.) in other examples. The drain of HS_M transistor is connected to the input voltage node VIN. The source of the HS_M transistor is connected to the drain of the LS_M transistor at the main switch node (SW_M), and the source of the LS_M transistor is connected to the ground node. The output of driver 531 is connected to the gate of the HS_M transistor, and the output of driver 532 is connected to the gate of the LS_M transistor. The PWM logic circuit 530 generates a drive signal (HSM_drv) to control the on/off state of the HS_M transistor and a drive signal (LSM_drv) to control the on/off state of the LS_M transistor. One terminal of the main inductor L1 is connected to the main switch node SW_M, and the other terminal of L1 is connected to capacitor C1 at the output node (VOUT).

The auxiliary half bridge 540 is structured similar to the main half bridge circuit 530. The auxiliary half bridge circuit 540 includes a high side auxiliary (HS_A) transistor, a low side auxiliary (LS_A) transistor and corresponding drivers 541 and 542. The HS_A and LS_A transistors comprise n-type FETs in this example, but can comprise other types of transistors as noted above. The drain of HS_A transistor is connected to the input voltage node VIN. The source of the HSA transistor is connected to the drain of the LS_A transistor at the auxiliary switch node (SW_A), and the source of the LS_A transistor is connected to the ground node. The output of driver 541 is connected to the gate of the HS_A transistor, and the output of driver 542 is connected to the gate of the LS_A transistor. The PWM logic circuit 520 generates a drive signal (HSA_drv) 523 to control the on/off state of the HSA_A transistor. The auxiliary inductor LA is connected between the auxiliary switch node SW_A and the main switch node SW_M.

Figure 7:
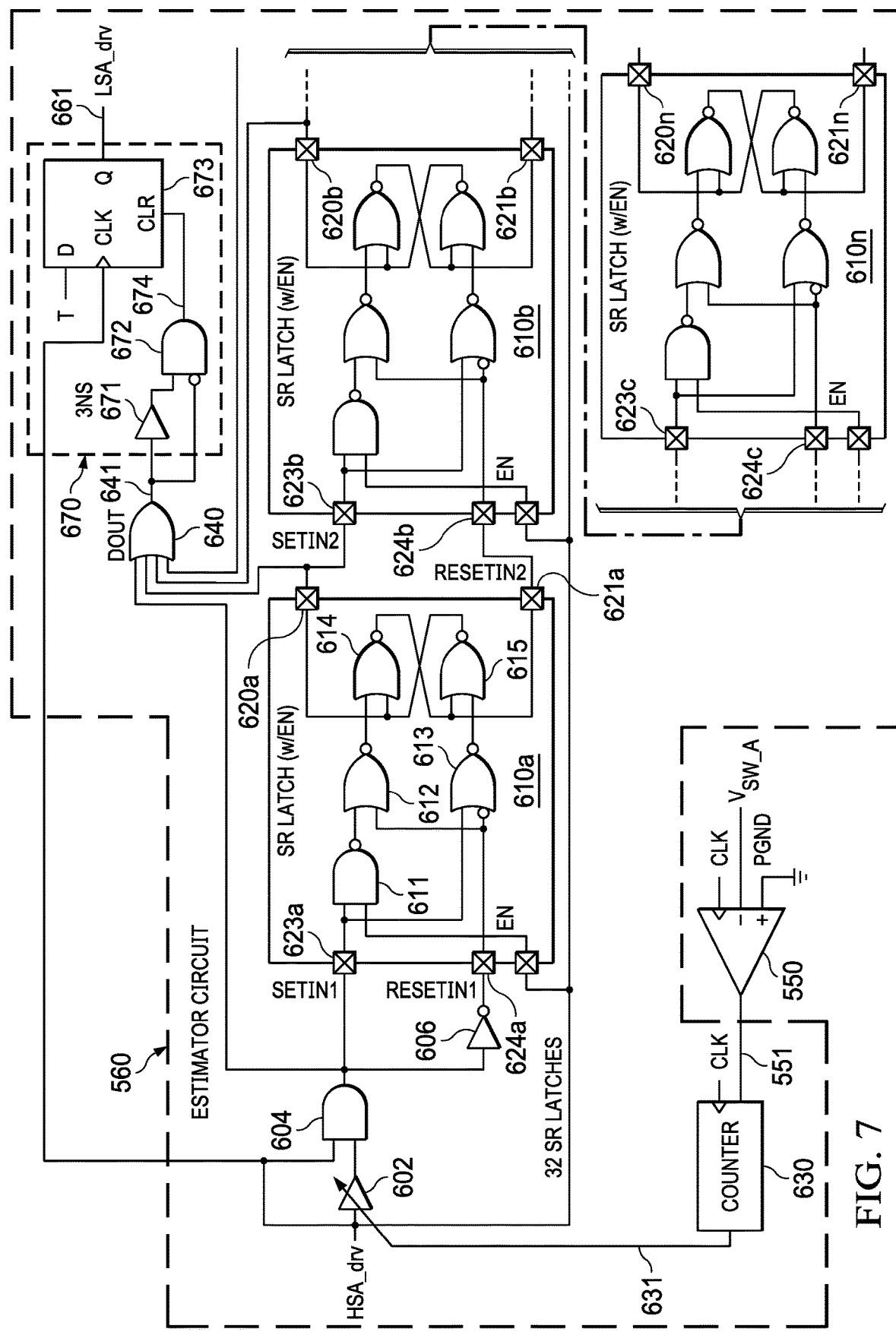
FIG. 7 shows an example implementation of the estimator circuit of FIG. 6.

The clocked comparator 550 includes a clock input and positive and negative inputs. The output signal 545 from driver 542 is connected to the clock input of the clocked comparator 550, but output signal 561 (LSA_drv) from estimator circuit 560 could be used instead to clock the comparator 550. The positive input of the clocked comparator 550 is connected to the auxiliary switch node SW_A, and the negative input of the clocked comparator is connected to the ground node. The clocked comparator 550 thus compares the SW_A voltage (which is the current through inductor LA times the on-resistance of the LS_A transistor) to the ground potential. The estimator circuit 560 uses the HSA_drv signal 523 from the PWM logic circuit 520 to estimate the on-time of the LS_A transistor (Ton_LSA), and the output 551 of comparator 550 provides fine tuning adjustment of the estimate of Ton_LSA. FIG. 7 (described below) shows an example implementation of the estimator circuit 560.

FIG. 6 shows the use of the estimator circuit 560 and clocked comparator 550 to determine when to turn off the LS_A transistor during DCM operation. In some applications, an estimator circuit and clocked comparator are used only for the auxiliary half bridge circuit 540, and not for the main half bridge circuit 530. In applications in which narrow pulse widths for the auxiliary half bridge 540 are implemented (e.g., 5-30 nanoseconds), but that use much wider pulse widths for the main half bridge 530, the estimator circuit/clocked comparator may not have any significant benefit for the main half bridge circuit 530. In the example of FIG. 6, a continuous voltage comparator 537 is included to determine when to turn off the LS_M transistor, as explained above regarding FIG. 1.

FIG. 7 shows an example implementation of the estimator circuit 560 of FIG. 6. The estimator circuit 560 in this example includes an adjustable delay element 602, an AND gate 604, an inverter 606, multiple SR latches 610a, 610b, . . . , 610n (collectively SR latches 610), a counter 630, an OR gate 640, and output circuit 570. The HSA_drv signal 523 from the PWM logic circuit 520 is coupled to the input of the adjustable delay element 602, and the output of the delay element is coupled to an input of AND gate 604. The HSA_drv signal 523 from the PWM logic circuit 520 also is coupled to the other input of the AND gate 604.

Each SR latch 610 in this example is similarly configured, and includes a NAND gate 611, and NOR gates 612, 613, 614, and 615, with NOR gate 613 having one of its inputs inverted as shown). Each SR latch 610 comprises an SR latch with an enable input Each SR latch includes a SETIN input 623 and a RESETIN input 624, and includes outputs 620 and 621. As such, the inputs to SR latch 610a includes SETIN1 623a and RESETIN1 624a and outputs 620a and 621a. The 620a and 621a outputs from SR latch 610a couple to corresponding SETIN and RESETIN inputs to SR latch 610b, specifically, SETIN2 623b and RESETIN2 624b. The SR latches 610 are connected in series as shown with the last SR lath 610n in the series chain having SETIN and RESETIN inputs 623c and 624c, respectively, and outputs 620n and 621n. The number (n) of SR latches 610 in the series chain can vary from implementation to implementation. In one example, n is 32, that is, the estimator circuit 560 includes 32 SR latches.

The NAND gate 611 of SR latch 610a includes an input that is coupled to the output of AND gate 604 (which is the SETIN1 623a input to the SR latch 610a), and another input that is coupled to the HSA_drv signal 523. The output of NAND gate 611 is coupled to an input of NOR gate 612, and the other input of NOR gate 612 is coupled to the output of the inverter 606 (which is the RESETIN1 624a input to the SR latch 610a). The output of NOR gate 612 is coupled to an input of NOR gate 614, and the other input of NOR gate 614 is coupled to the output of NOR gate 615, which also is the output 620a from the SR latch 610a. The NOR gate 613 includes an input that is coupled to the SETIN1 input 623a of the SR latch 610a, and the inverted input of NOR gate 613 is coupled to the RESETIN 624a input. The output of NOR gate 613 is coupled to an input of NOR gate 615, and the other input of NOR gate 615 is coupled to the output of NOR gate 614, which also is the output 621a of the SR latch 610a. The other SR latches 610b through 610n are similarly configured.

Each SR latch 610 thus has a SETIN 623 input and a RESETIN 624 input. The output 620 of each SR latch 610 is asserted high (and the output 621 is asserted low) responsive to the SETIN 623 input being asserted high. The output 620 of each SR latch 610 is asserted low (and the output 621 is asserted high) responsive to the RESETIN 624 input being asserted high. Each SR latch 610 functions as a delay circuit with a propagation delay a certain amount (the propagation delays of the NAND gate and NOR gates 612-615). The collection of SR latches 610a-610n thus represents a delay line. The outputs 620 of the SR latches 610 and the output of AND gate 604 are coupled to inputs of NOR gate 640. The output signal from OR gate 640 (DOUT 641) is provided to output circuit 670.

In this example, output circuit 670 includes a delay element 671, an AND gate 672 (with one input being inverted), and a data (D) flip-flop 673. The output circuit 670 may comprise additional or different components in other examples. The output signal from OR gate 640 is logically ANDed with its delay counterpart from the delay element 671, which results in a narrower positive pulse than the output of OR gate 640. The width of the pulse from AND gate 672 is equal to the delay implemented by delay element 671 (e.g., 3 nanoseconds). The D input to the D flip-flop 673 is connected to a logic high, and the HSA_drv signal 523 is used to clock the D flip-flop. In this example, a falling edge of HSA_drv clocks the logic high from the D input through to the Q output as the LSA_drv signal 561. The output of AND gate 671 is coupled to the clear (CLR) input of the D flip-flop 673, and a logic high from AND gate 671 clears the Q output (e.g., forces the Q output to a logic low).

FIG. 7 also includes the clocked comparator 550. Each time the comparator 550 is clocked (e.g., via output signal 545 from driver 542, FIG. 6), the output 551 from comparator 550 causes the output 631 from counter 630 to increment or decrement, depending on the logic state of output 551 from the comparator. For example, if the voltage on SW_A is greater than the ground potential when the comparator is clocked, the counter's output count value (output 631) is incremented. If the voltage on SW_A is smaller than the ground potential when the comparator is clocked, the counter's output count value is decremented. The output 631 from the counter 630 is coupled to the adjustable time delay element 602. The larger is the output value from counter 630, the larger will be the time delay implemented by the adjustable time delay element 602, and the smaller is the output value from counter 630, the smaller will be the time delay implemented by the adjustable time delay element.

Figure 8:
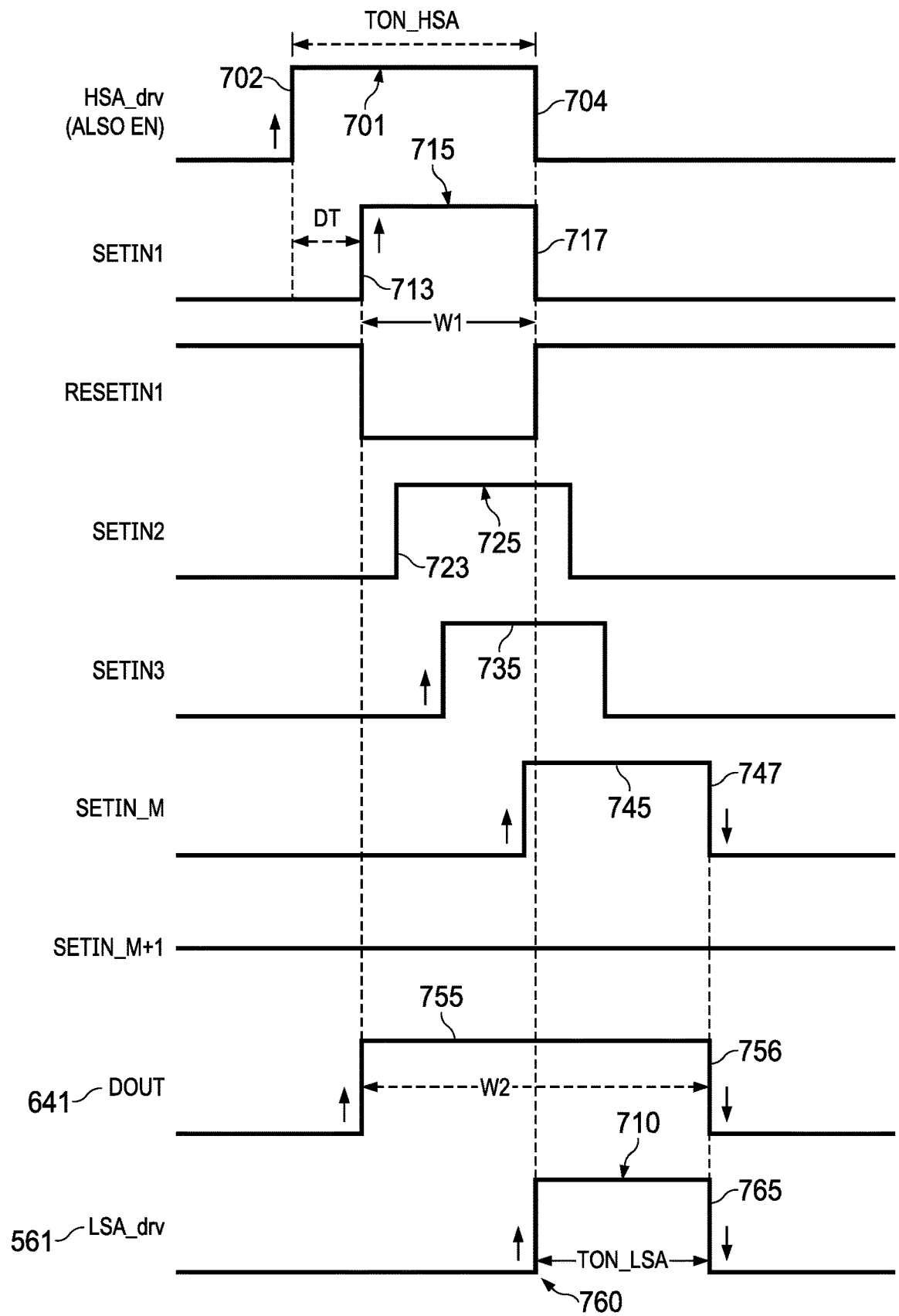
FIG. 8 shows an example timing diagram.

FIG. 8 is a timing diagram illustrating various signals within estimator circuit 560 of FIG. 7. The signals shown in FIG. 8 include the HSA_drv signal 523 (the transistor control signal to turn on and off the HS_A transistor), some of the SETIN input signals to the SR latches 610, RESETIN1, DOUT 641, and LSA_drv signal 561. The HSA_drv signal 523 includes a positive pulse 701 with a rising edge at 702 and a falling edge at 704. While the HSA_drv signal 523 is logic high, the HSA transistor is on. The width of the HSA_drv signal pulse is shown as Ton_HSA, and represents the time duration for which the HS_A transistor is on. As discussed above, the amount of time that the LS_A transistor is on in an auxiliary half bridge circuit of a ZVT buck converter is the same amount of time as for the HS_A transistor. The estimator circuit 560 generates a positive pulse 710 for the LSA_drv signal 561 with a pulse width Ton_LSA that is equal to Ton_HSA. The time delay introduced by the delay element 602 and one or more of the SR latches 610 is used to create pulse 710 with a Ton_LSA pulse width that is equal to Ton_HSA.

SETIN1 is shown in FIG. 8 as comprising a pulse 715 having a rising edge 713 that is delayed relative to the rising edge 702 of pulse 701 of HSA_drv. The delay is shown as "DT", which represents the time configurable time delay caused by delay element 602. Pulse 715 has a falling edge 717 that occurs commensurate with the falling edge 704 of pulse 701. The width W1 of pulse 715 thus is Ton_HSA−DT. RESETIN1 is the output signal from inverter 606, and thus is the logical inverse of SETIN1.

The SETIN1 signal causes the signal on the output 620a from the SR latch 610 (which is the SETIN2 623b to SR Latch 610b) to be asserted high at rising edge 723. The pulse width of pulse 725 matches that of the SETIN1. The rising edge 723 of pulse 725 is delayed relative to rising edge 713 of pulse 715 due to the propagation delay through SR latch 610a. The SETIN input to each subsequent SR latch 610 also causes the respective SR latch to generate an output pulse (SETIN to the next SR latch in the chain) with a time delay caused by the propagation delay of the SR latch. As the SR latches 610 have the same architecture, the propagation delays of the SR latches 610 are approximately the same. The SR latches 610 thus function as delay line. The pulse 725 of SETIN2 is delayed relative to pulse 715 by the propagation delay (PD) of the SR latch 610. The pulse 735 of SETIN3 is delayed relative to pulse 715 by 2×PD, and so on. The pulse 745 of SETINm is delayed relative to pulse 715 by m×PD.

The HSA_drv signal is also used as the enable (EN) input to each SR latch 610. Once the falling edge 704 of HSA_drv occurs, the EN input to each SR latch 610 is pulled low, which causes the signal on the output 620 (SETIN to the next SR latch) to be logic low and the signal on output 621 (RESETIN to the next SR latch) to be logic high. Each SR latch 610 from SR latch 610a to SR latch 610b, and so on, generates a delayed pulse 715, 725, etc. until HSA_drv is driven low, at which point all SR latches 610 that have received a positive pulse on their inputs 623, will be reset (signal on output 620 low and signal on output 621 high). FIG. 8 shows that SETINm+1 is thus logic low due to HSA_drv being low.

All of the SETIN signals from the SR latches 610 are OR'd together by OR gate 641, the output signal of which is DOUT. FIG. 8 shows a positive pulse 755 for DOUT which has a leading edge coinciding with leading edge 713 of SETIN1. As all off the SETIN pulses overlap in time, DOUT remains high until the falling edge 747 of pulse 745. The width W2 of pulse 755 is (2×Ton_HSA)−(2*DT).

DOUT (FIG. 7) is delayed by delay element 671. The delayed DOUT from delay element 671 is provided to one input of AND gate 672, and the undelayed DOUT is provided directly to the inverted input of AND gate 672. The AND gate 672 thus logically ANDs together a delayed DOUT (delayed by delay element 671) with a logical inverse of DOUT. The output signal 674 comprises a pulse having a rising edge that is delayed from DOUT by the delay introduced by the delay element 671, and having a pulse with that is W2 less the delay of delay element 671. The output signal 674 from AND gate 672 is provided to the clear (CLR) input to the flip-flop 673. HSA_drv is used to clock the flip-flop 673. The clock input to the flip-flop 673 is active upon a falling edge of its input. Thus, falling edge 704 clocks the flip-flop and causes the Q output to generate a logic high due to the D input being pulled high. FIG. 8 shows that LSA_drv (the Q output of flip-flop 561) is asserted high at 760 commensurate with the falling edge 704 of HSA_drv. DOUT becomes logic low at 756, which causes the CLR input to the flip-flop 673 to be pulled low thereby clearing the flip-flop 673 and forcing LSA_drv low at 765.

The pulse width of pulse 710 (Ton_LSA) of LSA_drv is approximately equal to Ton_HSA. The LS_A transistor is turned on during pulse 710 and turned off upon the falling edge 765. As explained above, the estimated on-time Ton_LSA for the LS_A transistor is a close approximation. The clocked comparator 550 and the counter 630 function to fine tune the estimate of Ton_LSA. If the voltage on SW_A is greater than the ground potential when the comparator is clocked, the counter's output 631 is increased, which thereby causes the configurable delay element 602 to increase the value of DT. As a result of a larger DT, the width of pulse 710 of LSA_drv is increased. The width of pulse 710 can be decreased as well by a reduction in the counter's output 631 (which will occur if the ground potential is larger than the voltage on SW_A when the comparator 550 is clocked).

Figure 9:
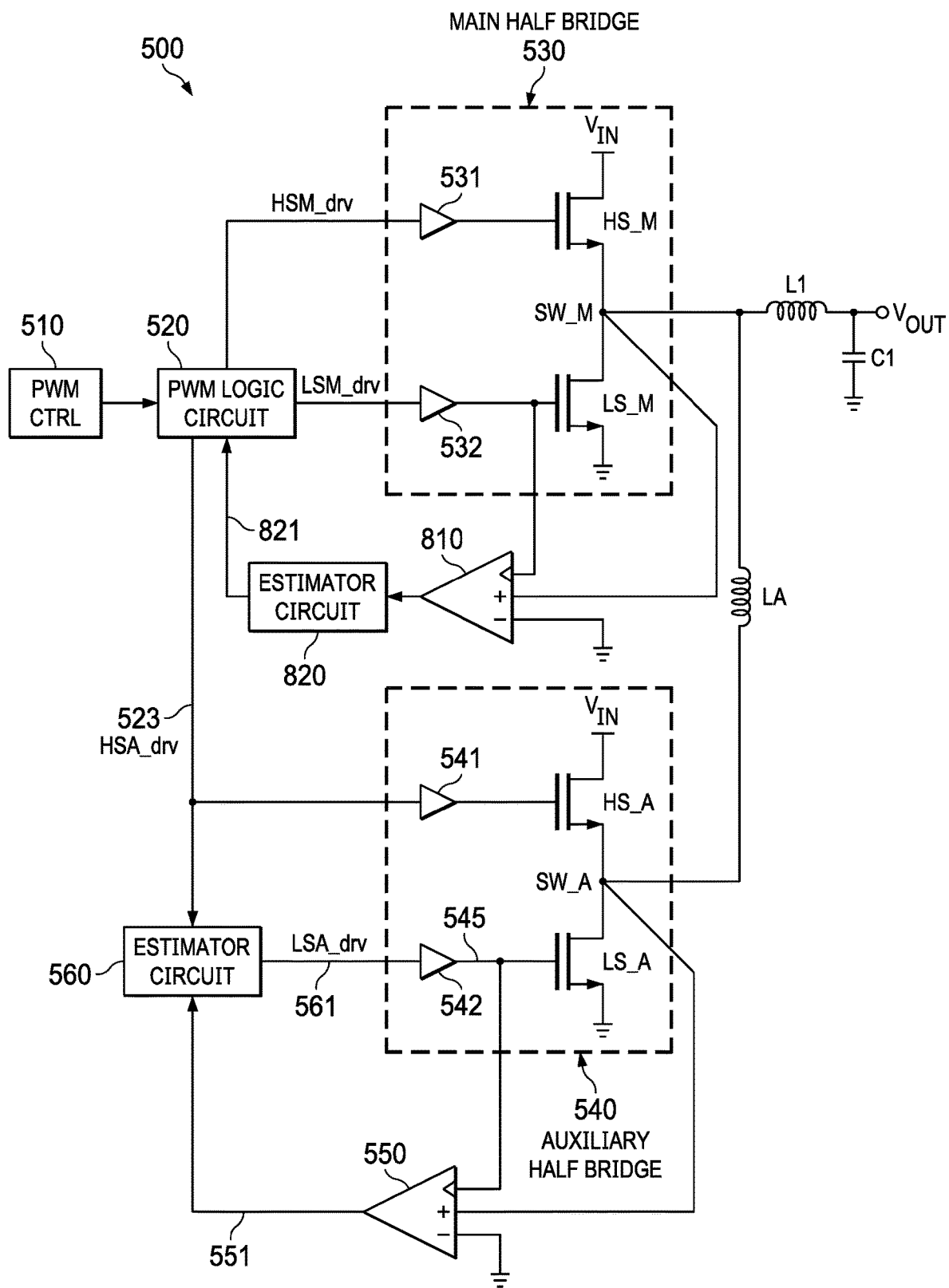
FIG. 9 shows another example of a ZVT buck converter with estimator circuits and clocked comparators for both the main and auxiliary half bridges.

As discussed above, the example of FIG. 6 includes a clocked comparator 550 and an estimator circuit 560 to help determine when to turn off the LSA transistor in the auxiliary half bridge circuit 540, but the example includes a continuous time voltage comparator 537 for the main half bridge circuit 530. In some applications, however, a clocked comparator and an estimator circuit is used for the main half bridge circuit 530 as well as for the auxiliary half bridge circuit 540. FIG. 9 shows an example similar to that of FIG. 6, but with a clocked comparator 810 and an estimator circuit 820 coupled to the main half bridge circuit 530, instead of a continuous time voltage comparator. The clocked comparator 810 has a positive input coupled to the main switch node (SW_M) and compares the voltage on the SW_M node to the ground potential. In some examples, the circuit implementation of the estimator circuit 820 is the same as for the estimator circuit 560. Estimator 820 operates the same as estimator circuit 350 in FIG. 4.

Figure 10:
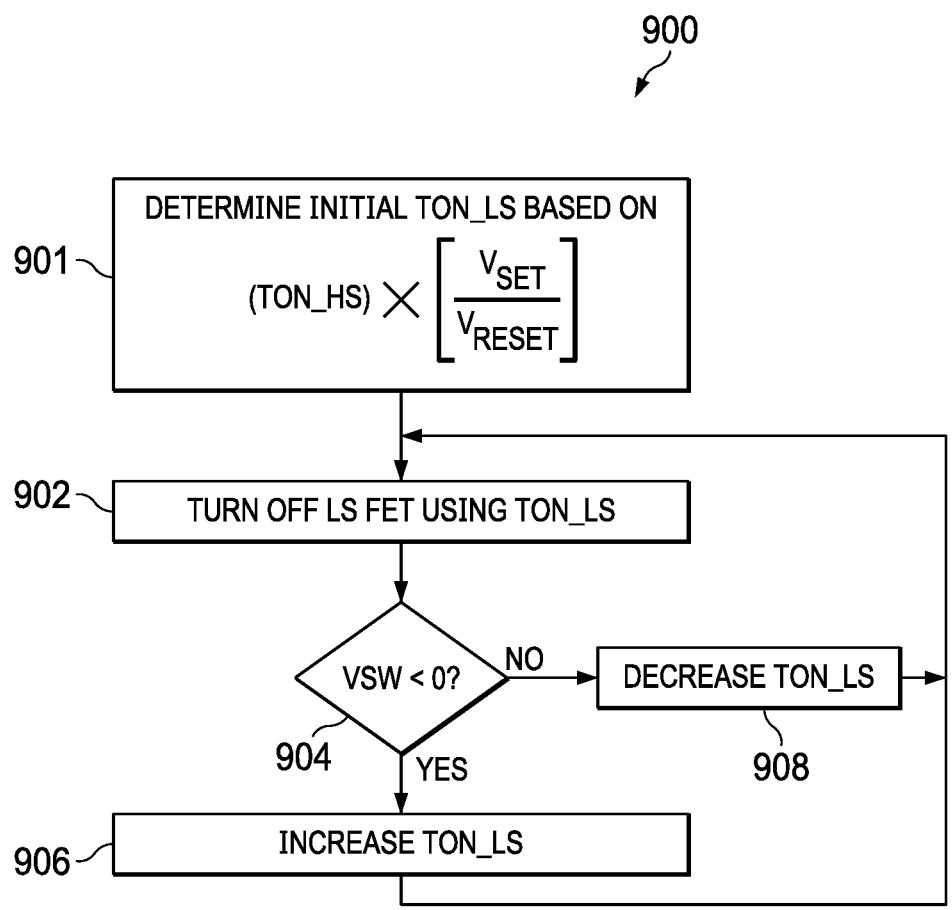
FIG. 10 shows an example of method of operation for adjusting the on-time of the low side transistor within a switching regulator.

FIG. 10 shows a method for estimating the on-time for the LS FET (e.g., LS FET in FIG. 4 and/or the LS_A FET in FIG. 6) and refining the estimate using a clocked comparator. At 901, the method includes determining an initial estimate of Ton_LS based on Eq. (2) above. At 902, after the LS FET has been turned on, the method includes turning off the LS FET using the Ton_LS estimate. At 904, the method includes determining whether the voltage on SW is positive or negative. If the voltage on SW is positive (the "NO" branch), TON_LS is decreased at 908. As discussed above, FIG. 7, for example, illustrates the use of a counter 630 to adjust the time delay of adjustable delay element 602 to implement operation 908. If, however, the voltage on SW is negative (the "YES" branch), TON_LS is increased at 906.

In this description, the term "couple" or "couples" means either an indirect or direct connection. Thus, if a first device couples to a second device, that connection may be through a direct connection or through an indirect connection via other devices and connections. The recitation "based on" means "based at least in part on." Therefore, if X is based on Y, X may be a function of Y and any number of other factors. Modifications are possible in the described embodiments, and other embodiments are possible, within the scope of the claims.

What is claimed is:
1. A circuit, comprising:
a first transistor having a gate coupled to a high side drive conductor, a drain coupled to an input voltage node, and having a source coupled to a switch node;

a second transistor having a gate coupled to a low side drive conductor, a drain coupled to the switch node, and having a source coupled to a ground node;

an arbiter circuit having a low side drive input, an estimator input, and having a drive output coupled to the gate of the second transistor;

a clocked comparator having a clock input coupled to the gate input of the second transistor, having a switch node input coupled to the switch node, having an input coupled to the ground node, and having a clocked comparator output; and an estimator circuit including:
an averager circuit having an input coupled to the high side drive conductor and having an average output;

first sample and hold circuitry having an input coupled to the high side drive conductor, having an inductor voltage input, and having a voltage set output;

second sample and hold circuitry having an input coupled to the low side drive conductor, having an input coupled to the inductor voltage input, and having a voltage reset output;

multiplier circuitry having an input coupled to the average output, having an input coupled to the set output, having an input coupled to the reset input, and having a low side time on output;

an adder having an input couple to the low side time on output, having an input coupled to the clocked comparator output, and having an adder output; and comparator circuitry having a high side drive ramp synchronized input, an input coupled to the adder output, and a low side actual on time output coupled to the estimator input.

2. The circuit of claim 1, in which the multiplier circuitry is configured to determine an on-time for the second transistor based on an on-time of the first transistor.

3. The circuit of claim 2, in which the multiplier comprises a Gilbert multiplier.

4. The circuit of claim 1, in which the circuit includes an averager circuit that is coupled to the high side drive conductor and average circuit is configures to generate an average output signal that is indicative of an average of a high side drive signal on the high side drive conductor.

5. A process of operating a buck converter comprising:
(a) determining a first on time for a low side transistor and determining an average on time for a high side transistor;

(b) turning on the low side transistor for the duration of the first on time by asserting a low side driver signal for a duration of the first on time;

(c) turning off the low side transistor by de-asserting the low side driver signal at the end of the first on time;

(d) clocking a comparator with the low side driver signal to determine a switch node voltage at a switch node coupled to the low side transistor at the end of the first on time;

(e) changing the first on time to a second on time in response to an average on time for the high side transistor, an inductor voltage, and the switch node voltage being positive or negative, and providing an estimator signal indicating the second on time;

(f) again turning on the low side transistor in response to the low side drive input signal by asserting the low side driver signal; and (g) arbitrating between the estimator signal and a low side drive input signal in turning off the low side transistor by de-asserting the low side driver signal.

6. The process of claim 5 in which the changing includes decreasing the first on time if the switch node voltage is positive.

7. The process of claim 5 in which the changing includes increasing the first on time if the switch node voltage is negative.

8. The process of claim 5 in which the changing includes maintaining the first on time if the switch node voltage is zero.

9. The process of claim 5 in which the changing includes sampling a voltage at an inductor coupled to the switch node.

10. The process of claim 5 in which the providing an estimator signal includes changing a count of a counter in response to the output of the comparator.

11. The process of claim 5 in which the providing an estimator signal includes sensing a voltage on an inductor coupled to the switch node.

12. The process of claim 5 in which the arbitrating includes turning off the low side transistor in response to the first of the low side drive input signal and the estimator signal to be de-asserted.

* * * * *